United States Patent [19]

Kouan et al.

[11] Patent Number: 4,916,402
[45] Date of Patent: Apr. 10, 1990

[54] APPARATUS FOR DETECTING DIRECT CURRENT MAGNETIC FLUX DEFLECTIONS OF AN ELECTRICAL TRANSFORMER

[75] Inventors: Toyokazu Kouan; Katsumi Shiono, both of Ako, Japan

[73] Assignee: Mitsubishi Denki Kabushiki Kaisha, Japan

[21] Appl. No.: 246,745

[22] Filed: Sep. 20, 1988

[30] Foreign Application Priority Data

Sep. 22, 1987 [JP] Japan .................. 62-238106
Feb. 5, 1988 [JP] Japan .................. 63-23851

[51] Int. Cl.⁴ ................. G01R 31/06; G01R 31/34
[52] U.S. Cl. ................................. 324/547; 324/726
[58] Field of Search ............ 324/520, 522, 546, 547, 324/55, 253–255

[56] References Cited

U.S. PATENT DOCUMENTS

| | | | |
|---|---|---|---|
| 3,714,545 | 1/1973 | Chiffert | 324/55 X |
| 3,863,109 | 1/1975 | Emanuel et al. | 317/14 R |
| 4,147,972 | 4/1979 | Hochstetter | 323/24 |
| 4,158,168 | 6/1979 | Harrold | 324/547 X |
| 4,300,095 | 11/1981 | Rhodes | 324/255 |
| 4,456,875 | 6/1984 | Chenier | 324/55 |
| 4,658,213 | 4/1987 | Finley | 324/546 |

FOREIGN PATENT DOCUMENTS

| | | |
|---|---|---|
| 57-97368 | 6/1982 | Japan . |
| 62-28353 | 2/1987 | Japan . |
| 0935803 | 6/1982 | U.S.S.R. .............. 324/55 |

Primary Examiner—Reinhard J. Eisenzopf
Assistant Examiner—Jack B. Harvey
Attorney, Agent, or Firm—Leydig, Voit & Mayer

[57] ABSTRACT

An apparatus for detecting direct current magnetic flux deflection of an electrical transformer comprising a magnetic detector for generating an output voltage waveform, an integrator connected to the magnetic detector for integrating the output voltage waveform from the magnetic detector. Positive and negative peak value detectors are connected to the integrator for detecting positive and negative peak values of the output voltage waveform integrated by the integrator. A comparator connected to the positive and the negative peak value detectors compares the positive and the negative peak values to provide a peak difference.

3 Claims, 5 Drawing Sheets

APPARATUS FOR DETECTING DIRECT CURRENT MAGNETIC FLUX DEFLECTIONS OF AN ELECTRICAL TRANSFORMER

BACKGROUND OF THE INVENTION

This invention relates to an apparatus and a process for detecting a direct current magnetic flux deflection of an electrical transformer which requires minimum space and which generates no loss or noise.

Since the a.c. output voltage from an inverter is generally low, it is necessary to connect the output voltage to the primary coil of an electrical transformer to boost the a.c. voltage. However, with an inverter which utilizes transistors or the like, the a.c. output voltage may include a d.c. component due to the deviation of the voltage drop in the respective arms of the inverter circuit as well as the deviation of the conduction periods of the transistors in the inverter. When the d.c. component is included in the a.c. output voltage from the inverter, an electrical transformer, which is connected as a load to the output terminal of the main circuit of the inverter, generates a d.c. magnetic flux deflection, causing the characteristics of the transformer to be degraded because of the increase in iron loss, excitation current, and noise. Therefore, the d.c. magnetic flux deflection in an electrical transformer must be detected and prevented.

Japanese Patent Application No. 62-28353 discloses one example of a conventional apparatus and process for detecting d.c. magnetic flux deflection in an electrical transformer. According to this apparatus, electrical current detecting means in which a saturable reactor for detecting an electric current is connected in parallel to the main circuit of the inverter, and polarity determining means for determining by a photo-coupler the polarity of the current in the reactor detected by the current detecting means are used.

However, with the conventional apparatus as above discussed, extra space for installing an additional bulky device, which is the saturable reactor, is necessary and the saturable reactor itself generates iron loss and noise.

SUMMARY OF THE INVENTION

Accordingly, an object of the present invention is to provide an apparatus for detecting direct current magnetic flux deflection of an electrical transformer which is free from the above-discussed problems.

Another object of the present invention is to provide an apparatus for detecting direct current magnetic flux deflection of an electrical transformer in which no extra space is necessary and no iron loss or noise are generated.

Still another object of the present invention is to provide a process for detecting direct current magnetic flux deflection of an electrical transformer which is free from the above-discussed problems.

Another object of the present invention is to provide a process for detecting direct current magnetic flux deflection of an electrical transformer in which no extra space is necessary and no iron loss or noise are generated.

With the above objects in view, the apparatus for detecting direct current magnetic flux deflection of an electrical transformer according to the present invention comprises a magnetic detector for generating an output voltage waveform, an integrator connected to the magnetic detector for integrating the output voltage waveform from the magnetic detector, a positive peak value detector connected to the integrator for detecting the positive peak value of the output voltage waveform integrated by the integrator, a negative peak value detector connected in series to the integrator and in parallel to the positive peak value detector for detecting the negative peak value of the output voltage waveform integrated by the integrator, and a comparator connected to the positive and the negative peak value detectors for comparing the positive and the negative peak values to provide a peak difference.

A process for detecting direct current magnetic flux deflection of an electrical transformer according to the present invention comprises a magnetic detector in an electromagnetically coupled relationship with the electrical transformer, integrating an output voltage from the magnetic detector, and comparing a positive peak value and a negative peak value of a waveform of the integrated output voltage.

BRIEF DESCRIPTION OF THE DRAWINGS

The present invention will become more readily apparent from the following detailed description of the preferred embodiments of the present invention taken in conjunction with the accompanying drawings, in which.

Throughout the drawings, the same reference numerals designate identical or corresponding components.

DESCRIPTION OF THE PREFERRED EMBODIMENTS

Figure 1:
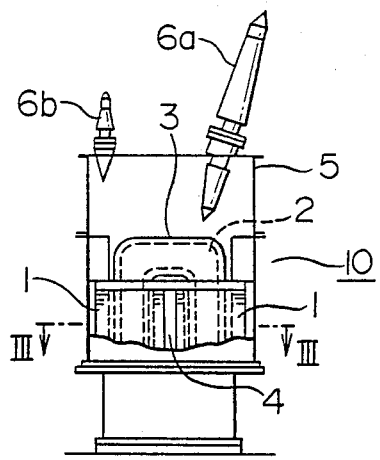
FIG. 1 is a schematic front view of a shell-type electrical transformer in which the apparatus for detecting d.c. magnetic flux deflection of the present invention is applied.
Figure 2:
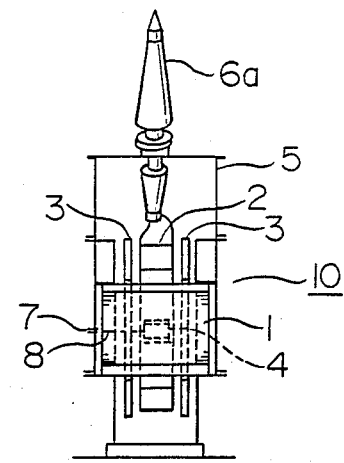
FIG. 2 is a schematic side view of the transformer shown in FIG. 1.
Figure 3:
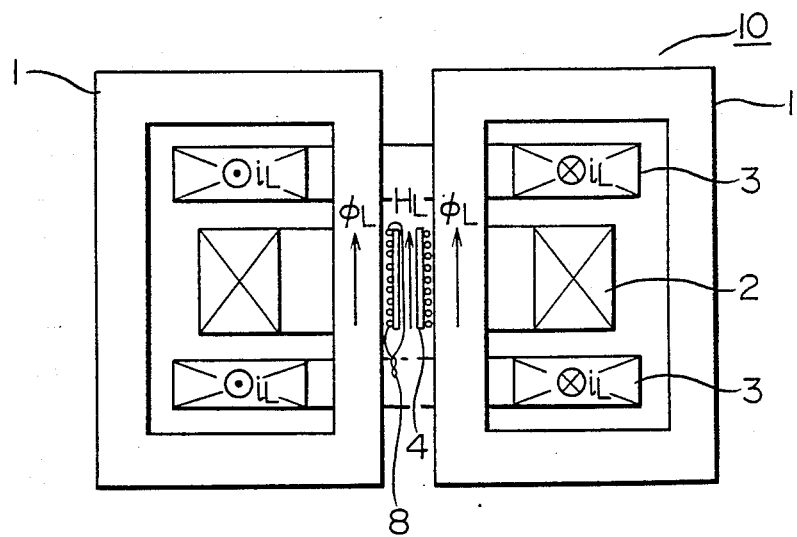
FIG. 3 is a horizontal sectional view taken along line III—III of FIG. 1.

In FIGS. 1 to 3, an electrical transformer 10 of the shell-type to which the apparatus for detecting magnetic flux deflection can be applied is illustrated. The transformer 10 comprises two substantially rectangular iron cores 1 supported by and contained within a tank 5. The iron cores 1 define magnetic circuits of the electrical transformer 10, and primary low voltage coils 3 and a secondary high voltage coil 2 are wound on the iron cores 1. The secondary coil 2 is connected to electrical bushings 6a and 6b of different size mounted on the tank 5 for external connection. It is seen that a magnetic detector 4 of the direct current magnetic flux deflection detecting apparatus of the present invention is disposed between two iron cores 1. The magnetic detector 4 is electrically connected by a lead 8 to output terminals 7 mounted on the tank 5 so that the output voltage from the magnetic detector 4 can be supplied to the external circuit which will be described later.

As shown in FIG. 3, in an unloaded excitation condition in which no load is connected to the high voltage coil 2, when an excitation current $i_L$ flows through the respective low voltage coils 3, a magnetic flux $\phi_L$ is generated in the respective iron cores 1 by this excitation current $i_L$ and a magnetic field $H_L$ corresponding to the magnetization force of the iron cores 1 is generated.

According to the present invention, a magnetic detector 4 is disposed in the vicinity of the iron cores 1. In the embodiment shown in FIG. 3, the magnetic detector 4 is a search coil. While the magnetic detector 4 shown in FIGS. 1 to 3 is located substantially at the center of the iron cores 1, it may be positioned relative in any other position to the iron cores 1 so that the magnetic field $H_L$ can be detected by the magnetic detector 4.

Figure 4:
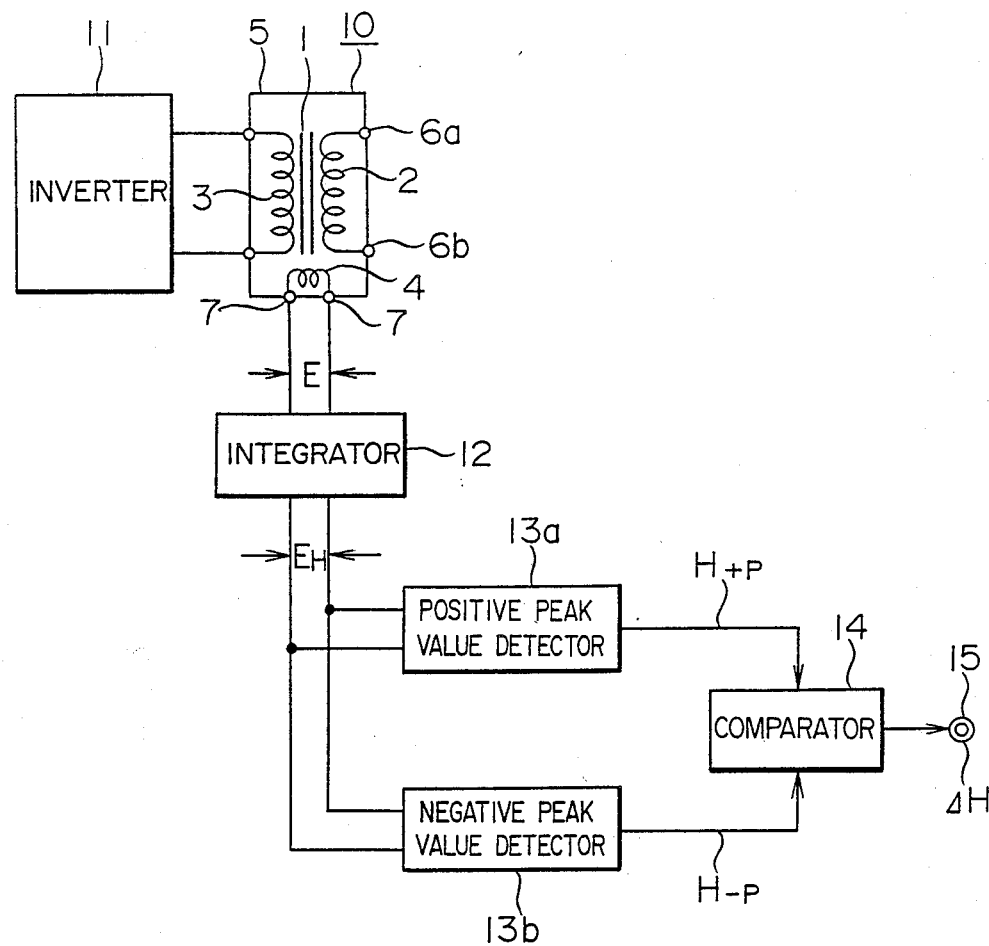
FIG. 4 is a block diagram of a direct current magnetic flux deflection detection circuit used in one embodiment of the present invention in which a search coil is used.

In FIG. 4 in which a block diagram of the d.c. magnetic flux deflection detection apparatus of the present invention is illustrated, it is seen that the apparatus is used with the electrical transformer 10 connected to an inverter 11. The inverter 11 is connected to the low-voltage primary coil 3 of the electrical transformer 10. The high-voltage secondary coil 2 can be connected to a desired load (not shown) through the bushings 6a and 6b mounted on the tank 5.

The magnetic detector 4 in the form of a search coil is disposed within the tank 5 and connected through the output terminal 7 to an integrator 12. The integrator 12 is connected at its output to a positive peak value detector 13a as well as to a negative peak value detector 13b. The positive and the negative peak value detectors 13a and 13b are in parallel to each other. The respective outputs of the positive and the negative peak value detectors 13a and 13b are connected to a comparator 14 which in turn is connected to an output terminal 15.

When the transformer 10 is in operation, an output voltage E [V] is obtained at the output terminals 7 of the search coil 4. Since the output voltage E [V] from the search coil 4 is proportional to the magnetic field H in the space in which the search coil 4 is disposed, differentiated in terms of time, it can be expressed by:

$$E = N \cdot S \cdot \mu dH/dt \quad (1)$$

where,
N: number of turns of the search coil
S: cross-sectional area of the search coil [m²]
u: permeability of the search coil core [H/m]
H: magnetic field [A/m]

This output voltage E is supplied to the integrator 12 where it is integrated to provide an integrated output voltage $E_H$. Since this output voltage $E_H$ from the integrator 12 is an amount of the output voltage E from the search coil 4 integrated in terms of time, it can be expressed by:

$$E_H = A \int E dt$$

where, A: integration constant of the integrator. By substituting equation (1):

$$E_H = (A/N \cdot S \cdot \mu) H \quad (2)$$

This output voltage $E_H$ thus integrated is supplied to the positive peak value detector 13a on one hand and to the negative peak value detector 13b on the other hand. In the positive peak value detector 13a, a positive peak value $H_{+P}$ of the integrated output voltage $E_H$ is detected, and a negative peak value $H_{-P}$ of the output voltage $E_H$ is detected by the negative peak value detector 13b. These detected positive and negative peak values $H_{+P}$ and $H_{-P}$ are supplied to the comparator 14, where a peak differential $\Delta H$ which is expressed by:

$$\Delta H = H_{+P} - H_{-P}$$

is generated and supplied from the output terminal 15.

Figure 5:
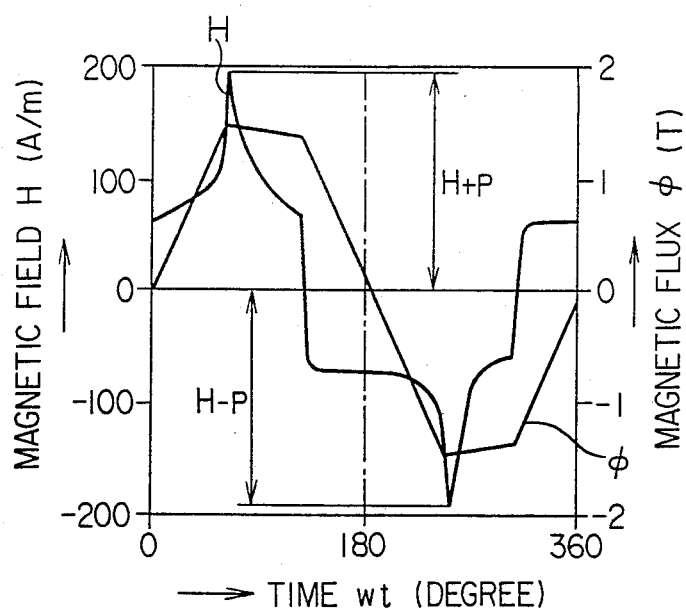
FIG. 5 is a graph showing the waveforms of the magnetic field and the magnetic flux as plotted against time obtained from the direct current magnetic flux deflection detection circuit shown in FIG. 4 and where no direct current magnetic flux deflection is generated.
Figure 6:
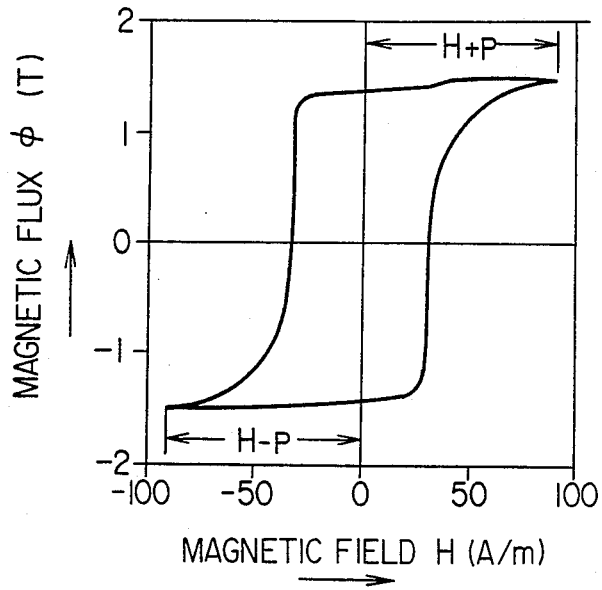
FIG. 6 is a graph showing the waveform of the magnetic flux as plotted against the magnetic field obtained from the direct current magnetic flux deflection detection circuit shown in FIG. 4 and where no direct current magnetic flux deflection is generated.

When there is no direct current magnetic flux deflection generated in the electrical transformer 10, since the magnetization force of the iron core 1 is symmetric in the positive and the negative directions, the positive peak value $H_{+P}$ and the negative peak value $H_{-P}$ of the magnetic field H are in symmetry as shown in FIGS. 5 and 6. In the graph of FIG. 5, waveforms of the magnetic field and the magnetic flux as plotted against time obtained from the direct current magnetic flux deflection detection circuit shown in FIG. 4 and when no direct current magnetic flux deflection is generated in the transformer are shown. The graph of FIG. 6 shows waveform of the magnetic flux as plotted against the magnetic field obtained from the direct current magnetic flux deflection detection circuit shown in FIG. 4 when no direct current magnetic flux deflection is generated. Therefore, when no direct current magnetic flux deflection is generated, the peak difference $\Delta H$ obtained from the output terminal 15 is zero.

Figure 7:
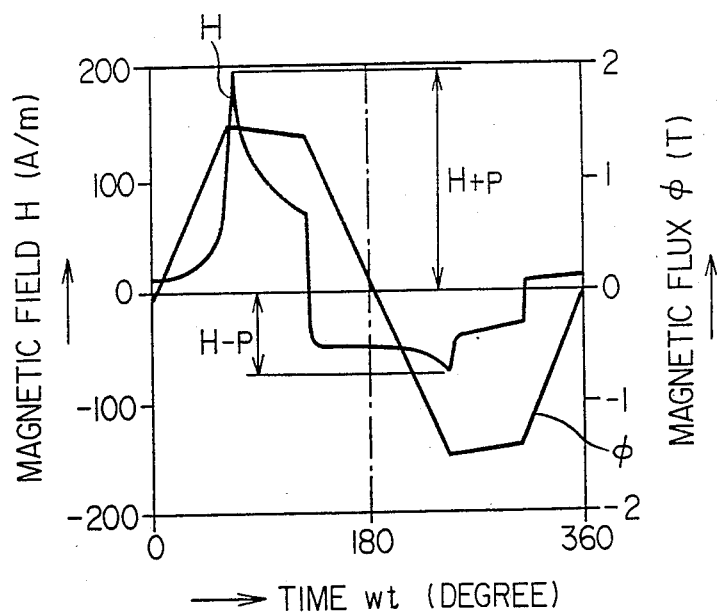
FIG. 7 is a graph similar to FIG. 5 but where a direct current magnetic flux deflection is generated.
Figure 8:
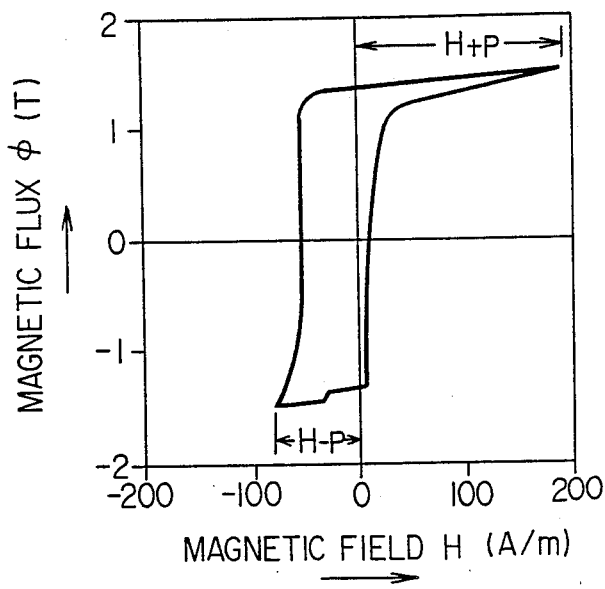
FIG. 8 is a graph similar to FIG. 6 but where a direct current magnetic flux deflection is generated.

When a direct current magnetic flux deflection is generated in the electrical transformer 10, since the magnetization force of the iron cores 1 becomes asymmetrical in the positive and the negative directions, the positive and negative peak values $H_{+P}$ and $H_{-P}$ of the magnetic field H become asymmetrical as shown in FIGS. 7 and 8, resulting in, for example, a smaller negative peak value $H_{-P}$. Therefore, the generation of the direct current magentic flux deflection by the peak difference $\Delta H$ supplied from the comparator 14 can be detected.

Figure 9:
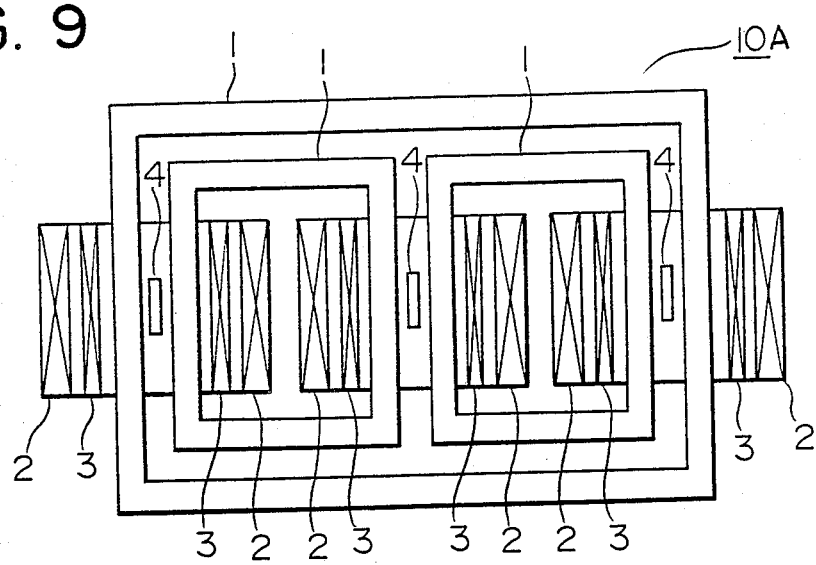
FIG. 9 is a sectional view of a core-type electrical transformer to which the present invention is applicable.

The electrical transformer to which the present invention is applicable may be of the shell type transformer 10 as shown in FIGS. 1 to 3, or of the core type transformer 10A as shown in FIG. 9, providing similar advantageous results.

Figure 10:
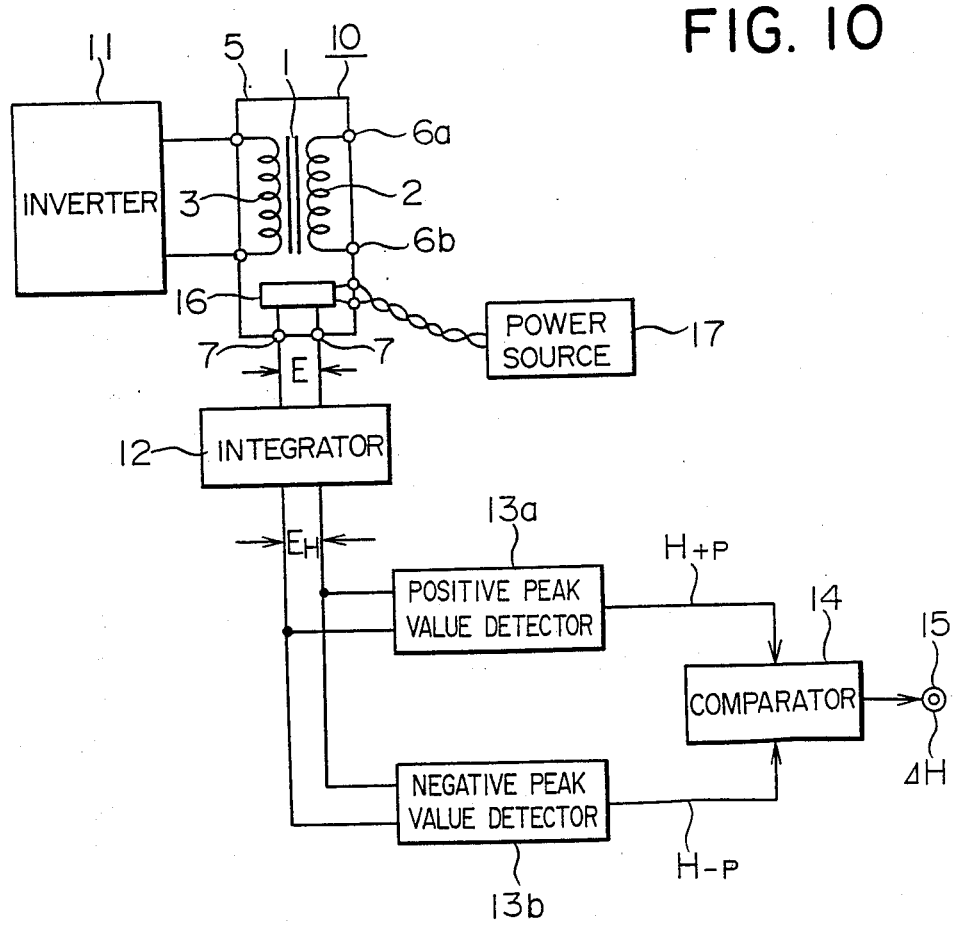
FIG. 10 is a block diagram similar to FIG. 4 but illustrating another embodiment in which a Hall element is used as the magnetic detector.

While the search coil 4 is used as the magnetic detector in the above-described embodiments, a Hall element shown in FIG. 10 may equally be used. In this case, while an additional electric power source is necessary for driving the Hall element, a direct current magnetic flux deflection detection circuit similar to that shown in FIG. 4 may be utilized.

As has been described, according to the present invention, a direct current magnetic flux deflection is detected by utilizing the fact that the magnetization force of the iron core becomes asymmetric when a direct current magnetic flux deflection is generated by providing a magnetic detector in the vicinity of an iron core of the electrical transformer, integrating an output voltage from the magnetic detector, and by comparing a positive peak value and a negative peak value of a waveform of the integrated output voltage, providing a process for detecting a d.c. magnetic flux deflection of an electric transformer in which no extra space is necessary and no iron loss or noise are generated.

What is claimed is:

1. An apparatus for detecting direct current magnetic flux deflection in an electrical transformer comprising:
   - a transformer having a primary winding and a secondary winding;
   - a magnetic detector electrically isolated from the primary and secondary windings of the transformer for detecting the magnetic flux deflection of the transformer and for generating an output voltage waveform in response to the magnetic flux deflection;
   - an integrator connected to said magnetic detector for integrating the output voltage waveform from said magnetic detector;
   - a positive peak value detector connected to said integrator for detecting positive peak values of the output voltage waveform integrated by said integrator;
   - a negative peak value detector connected in series to said integrator and in parallel to said positive peak value detector for detecting negative peak values of the output voltage waveform integrated by said integrator; and
   - a comparator connected to said positive and said negative peak value detectors for comparing the positive peak values from said positive peak value detector to the negative peak values from said negative peak value detector to provide peak difference values indicative of the direct current magnetic flux deflection of said transformer.

2. An apparatus for detecting direct current magnetic flux deflection of an electrical transformer as claimed in claim 1 wherein said magnetic detector comprises a search coil.

3. An apparatus for detecting direct current magnetic flux deflection of an electrical transformer as claimed in claim 1 wherein said magnetic detector comprises a Hall element.

* * * * *